United States Patent
Tomita et al.

(10) Patent No.: US 9,773,900 B2
(45) Date of Patent: Sep. 26, 2017

(54) SEMICONDUCTOR DEVICE

(71) Applicant: TOYOTA JIDOSHA KABUSHIKI KAISHA, Toyota-shi, Aichi-ken (JP)

(72) Inventors: Hidemoto Tomita, Toyota (JP); Masakazu Kanechika, Nagakute (JP); Hiroyuki Ueda, Nagakute (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/240,745

(22) Filed: Aug. 18, 2016

(65) Prior Publication Data
US 2017/0098701 A1   Apr. 6, 2017

(30) Foreign Application Priority Data
Oct. 2, 2015   (JP) .................. 2015-196735

(51) Int. Cl.
*H01L 29/34*   (2006.01)
*H01L 29/778*   (2006.01)
(Continued)

(52) U.S. Cl.
CPC ...... *H01L 29/7787* (2013.01); *H01L 29/1066* (2013.01); *H01L 29/205* (2013.01);
(Continued)

(58) Field of Classification Search
CPC ........... H01L 29/66462; H01L 29/1066; H01L 29/2003; H01L 29/7787; H01L 29/42316; H01L 29/7786
See application file for complete search history.

(56) References Cited

U.S. PATENT DOCUMENTS 5,929,467 A * 7/1999 Kawai ............... H01L 21/28194
                                                   257/192
7,612,390 B2 * 11/2009 Saxler ................. H01L 29/2003
                                                   257/194
(Continued)

FOREIGN PATENT DOCUMENTS

JP     2009-302388 A    12/2009
JP     2011-029507 A    2/2011
(Continued)

*Primary Examiner* — Jaehwan Oh
(74) *Attorney, Agent, or Firm* — Oliff PLC

(57) ABSTRACT

A semiconductor device includes: an electron transit layer constituted of GaN; an electron supply layer constituted of $In_{x1}Al_{y1}Ga_{1-x1-y1}N$ ($0 \le x1 < 1$, $0 \le y1 < 1$, $0 < 1-x1-y1 < 1$) and provided on the electron transit layer; a source electrode and a drain electrode that are provided on the electron supply layer and located apart from each other; a threshold voltage adjustment layer constituted of $In_{x2}Al_{y2}Ga_{1-x2-y2}N$ ($0 \le x2 < 1$, $0 \le y2 < 1$, $0 < 1-x2-y2 \le 1$) of a p-type and provided on a part of the electron supply layer located between the source electrode and the drain electrode; and a gate electrode provided on the threshold voltage adjustment layer. A high resistance layer is respectively interposed both between the gate electrode and the threshold voltage adjustment layer, and between the threshold voltage adjustment layer and the electron supply layer.

3 Claims, 2 Drawing Sheets

(51) Int. Cl.
  *H01L 29/205*  (2006.01)
  *H01L 29/43*   (2006.01)
  *H01L 29/10*   (2006.01)
  *H01L 29/20*   (2006.01)
  *H01L 29/47*   (2006.01)
  *H01L 29/201*  (2006.01)

(52) U.S. Cl.
  CPC ........ *H01L 29/432* (2013.01); *H01L 29/7786* (2013.01); *H01L 29/201* (2013.01); *H01L 29/2003* (2013.01); *H01L 29/34* (2013.01); *H01L 29/475* (2013.01)

(56) References Cited

U.S. PATENT DOCUMENTS

| | | | |
|---|---|---|---|
| 2012/0193637 A1 | 8/2012 | Kalnitsky et al. | |
| 2012/0313106 A1 | 12/2012 | He | |
| 2013/0075751 A1* | 3/2013 | Imanishi | H01L 29/66462 257/76 |
| 2013/0082276 A1 | 4/2013 | Park et al. | |
| 2013/0256679 A1* | 10/2013 | Yao | H01L 29/41725 257/76 |
| 2013/0256683 A1 | 10/2013 | Imanishi | |
| 2014/0151748 A1 | 6/2014 | Nishimori et al. | |
| 2015/0279982 A1* | 10/2015 | Yamamoto | H01L 29/42316 257/76 |
| 2015/0295073 A1 | 10/2015 | Tomita et al. | |
| 2016/0197174 A1* | 7/2016 | Kanechika | H01L 29/66462 257/194 |

FOREIGN PATENT DOCUMENTS

| | | |
|---|---|---|
| JP | 2013-004967 A | 1/2013 |
| JP | 2013-074179 A | 4/2013 |
| JP | 2013-080894 A | 5/2013 |
| JP | 2013-207107 A | 10/2013 |
| JP | 2014-027187 A | 2/2014 |
| JP | 2014-110393  | 6/2014 |
| JP | 2014-207379 A | 10/2014 |
| JP | 2015-070151 A | 4/2015 |
| JP | 2015-204304 A | 11/2015 |

* cited by examiner

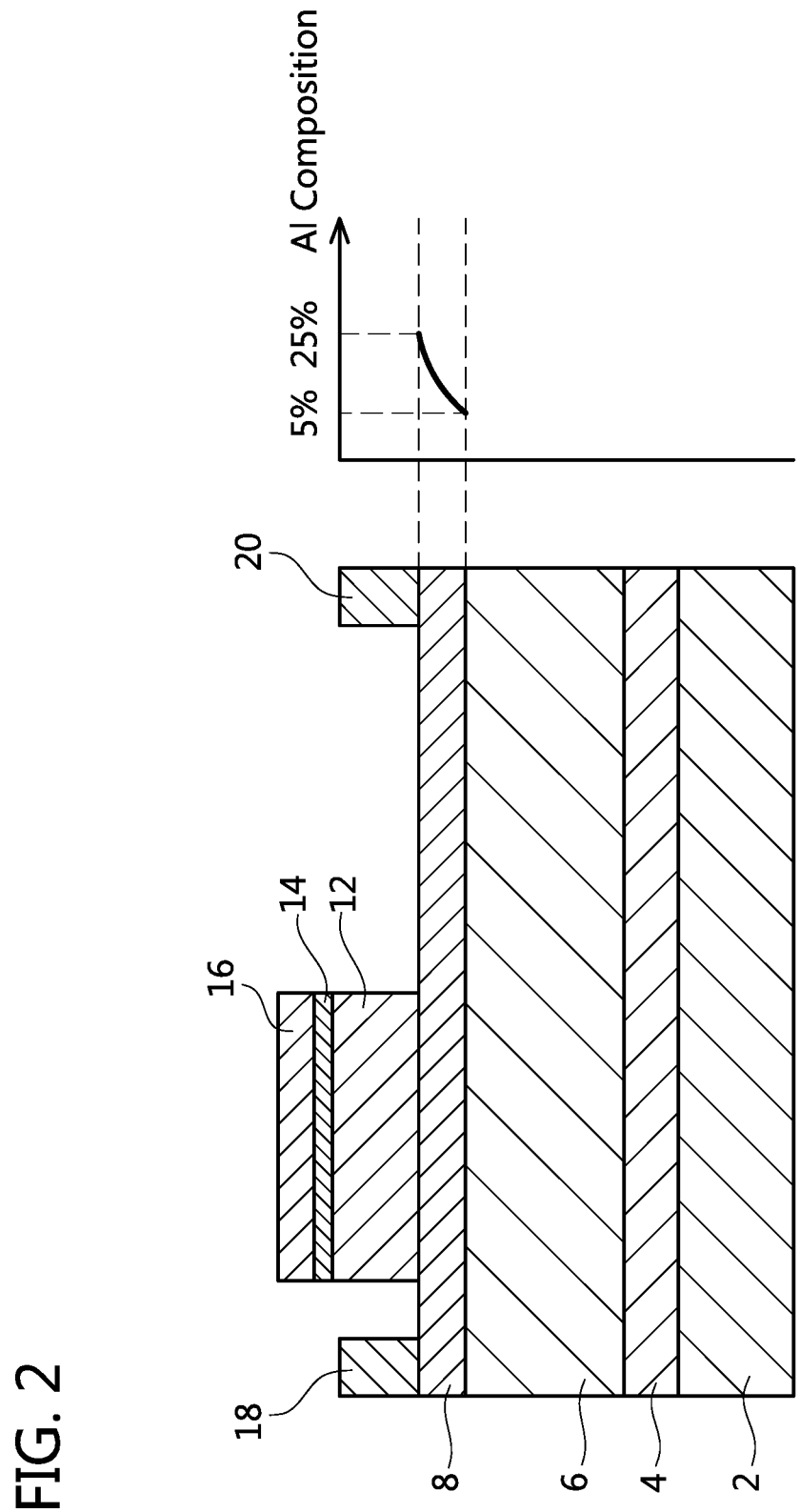

SEMICONDUCTOR DEVICE

CROSS-REFERENCE TO RELATED APPLICATION

This application claims priority to Japanese Patent Application No. 2015-196735 filed on Oct. 2, 2015, the entire contents of which are hereby incorporated by reference into the present application.

TECHNICAL FIELD

The present application discloses a semiconductor device that utilizes two-dimensional electron gas generated at a heterojunction interface between nitride semiconductors, and in which a leak current from a gate electrode is suppressed to a lower level, and accordingly change in a threshold voltage is suppressed.

DESCRIPTION OF RELATED ART

When an $In_{x1}Al_{y1}Ga_{1-x1-y1}N$ layer ($0 \leq x1 < 1$, $0 \leq y1 < 1$, $0 < 1-x1-y1 < 1$) is laminated on a gallium nitride (GaN) layer, two-dimensional electron gas is generated in a region in the GaN layer which is along a heterojunction interface. Herein, the GaN layer where the two-dimensional electron gas is generated is referred to as an electron transit layer, and the $In_{x1}Al_{y1}Ga_{1-x1-y1}N$ layer that creates the two-dimensional electron gas is referred to as an electron supply layer. By providing a source electrode and a drain electrode on the electron supply layer at positions apart from each other, a semiconductor device with a reduced source-drain resistance by the two-dimensional electron gas can be achieved.

When a p-type $In_{x2}Al_{y2}Ga_{1-x2-y2}N$ layer ($0 \leq x2 < 1$, $0 \leq y2 < 1$, $0 < 1-x2-y2 \leq 1$) is provided on a part of the electron supply layer positioned between the source electrode and the drain electrode, and a gate electrode is provided thereon, threshold voltage can be adjusted by an impurity concentration of the p-type $In_{x2}Al_{y2}Ga_{1-x2-y2}N$ layer and the like. The threshold voltage can be also adjusted so as to have a positive value as needed, that is, such that the semiconductor device has a normally-off characteristic. Herein, the p-type $In_{x2}Al_{y2}Ga_{1-x2-y2}N$ layer provided between the electron supply layer and the gate electrode is referred to as a threshold voltage adjustment layer.

In a semiconductor device that utilizes a heterojunction between nitride semiconductors and the threshold voltage adjustment layer, a leak current from the gate electrode is a problem. In arts disclosed in Japanese Patent Application Publication No. 2011-29507 (hereinafter referred to as Patent Literature 1) and Japanese Patent Application Publication No. 2013-80894 (hereinafter referred to as Patent Literature 2), an n-type GaN layer is provided between the gate electrode and the p-type threshold voltage adjustment layer, thereby suppressing the leak current from the gate electrode to a lower level by using a pn junction therebetween. In an art disclosed in Japanese Patent Application Publication No. 2015-70151 (hereinafter referred to as Patent Literature 3), a p-type GaN layer having a high resistance and a low impurity concentration is provided between the gate electrode and the threshold voltage adjustment layer, thereby suppressing the leak current from the gate electrode to a lower level. Providing an i-type GaN layer can also suppress the leak current to a lower level. In an art disclosed in Japanese Patent Application Publication No. 2015-204304 (hereinafter referred to as Patent Literature 4), a nitride semiconductor layer which forms a heterojunction with the threshold voltage adjustment layer is provided between the gate electrode and the threshold voltage adjustment layer. A barrier formed at the heterojunction suppresses the leak current from the gate electrode to a lower level. In an art disclosed in Japanese Patent Application Publication No. 2013-4967 (hereinafter referred to as Patent Literature 5), an insulating layer not containing Ga is provided between the gate electrode and the threshold voltage adjustment layer. The insulating layer that does not contain Ga has a higher resistance than an insulating layer that contains Ga, and thus it can suppress the leak current from the gate electrode to a lower level.

An art in which a high resistance layer is provided between the threshold voltage adjustment layer and the electron supply layer has also been proposed. In arts disclosed in Japanese Patent Application Publication No. 2013-74179 (hereinafter referred to as Patent Literature 6) and Japanese Patent Application No. 2013-189147 (hereinafter referred to as Patent Literature 7), between the threshold voltage adjustment layer constituted of GaN and the electron supply layer constituted of AlGaN, a nitride semiconductor layer which has a wider band gap than the AlGaN of the electron supply layer is provided. The nitride semiconductor layer with the wider band gap serves as a high resistance layer, thus suppressing holes from being implanted from the threshold voltage adjustment layer into the electron transit layer via the electron supply layer, and thereby preventing an increase in on-resistance due to holes accumulating in a channel.

SUMMARY

Although the disclosed in Patent Literatures 1 to 5 are useful in suppressing the leak current from the gate electrode to a lower level, through studies conducted thereafter until the present invention, it has been revealed that these arts are incapable of suppressing a phenomenon in which the threshold voltage changes in some cases or over time.

Although the arts disclosed in Patent Literatures 6 and 7 are intended to prevent the increase in on-resistance, the arts have come to consequently have an effect of suppressing the leak current from the gate electrode to a lower level. However, it has been revealed that even these arts cannot suppress the phenomenon in which the threshold voltage changes in some cases or over time.

The present disclosure provides a semiconductor device in which the leak current from the gate electrode is suppressed to a lower level, and the change in the threshold voltage is suppressed.

Regarding the arts described in Patent Literatures 1 to 5, causes for the change in threshold voltage have been studied in various ways. In the arts of Patent Literatures 1 to 5, a high resistance layer is provided between the gate electrode and the threshold voltage adjustment layer. Consequently, it can certainly be prevented that carriers transfer from the gate electrode to the threshold adjustment layer, and be prevented an amount of electrification charges in the threshold voltage adjustment layer accordingly changes. However, no countermeasures are taken for a transfer of the carriers from the threshold voltage adjustment layer to the electron supply layer, and hence the amount of electrification charges in the threshold voltage adjustment layer is not kept constant. The threshold voltage adjustment layer is constituted of the p-type nitride semiconductor layer, and has crystal defects resulted from doping of a p-type element. The carriers are trapped in the crystal defects, whereby the amount of electrification charges in the threshold voltage adjustment layer affects the threshold voltage. If the amount of electrification charges in the threshold voltage adjustment layer is not kept constant, the threshold voltage undesirably changes. With regard to the arts described in Patent Literatures 1 to 5, it was found that the amount of electrification charges in the threshold voltage adjustment layer changes in some cases or over time, thereby changing the threshold voltage.

The arts described in Patent Literatures 6 and 7 can prevent the change in the amount of electrification charges in the threshold voltage adjustment layer due to the transfer of carriers from the threshold voltage adjustment layer to the electron supply layer. However, no countermeasures are taken for the transfer of the carriers from the gate electrode to the threshold voltage adjustment layer, and hence the amount of electrification charges in the threshold voltage adjustment layer is not kept constant. Even in the arts described in Patent Literatures 6 and 7, the amount of electrification charges in the threshold voltage adjustment layer changes in some cases or over time, thereby undesirably changing the threshold voltage.

A semiconductor device disclosed herein comprises an electron transit layer, an electron supply layer, a source electrode, a drain electrode, a threshold voltage adjustment layer, and a gate electrode, and is characterized in that a high resistance layer is respectively interposed both between the gate electrode and the threshold voltage adjustment layer, and between the threshold voltage adjustment layer and the electron supply layer. The electron transit layer is constituted of gallium nitride (GaN). The electron supply layer is constituted of $In_{x1}Al_{y1}Ga_{1-x1-y1}N$ ($0 \leq x1 < 1$, $0 \leq y1 < 1$, $0 < 1-x1-y1 < 1$) and is provided on the electron transit layer. The source electrode and the drain electrode are provided on the electron supply layer. The source electrode and the drain electrode are apart from each other. The threshold voltage adjustment layer is constituted of $In_{x2}Al_{y2}Ga_{1-x2-y2}N$ ($0 \leq x2 < 1$, $0 \leq y2 < 1$, $0 < 1-x2-y2 \leq 1$) of a p-type, and is provided on the electron supply layer. The threshold voltage adjustment layer is located on a part of the electron supply layer between the source electrode and the drain electrode. The gate electrode is provided on the threshold voltage adjustment layer.

The above-mentioned semiconductor device prevents carriers from transferring not only between the gate electrode and the threshold voltage adjustment layer, but also between the threshold voltage adjustment layer and the electron supply layer. As a result, the amount of electrification charges in the threshold voltage adjustment layer can be prevented from changing in some cases or over time. Consequently, the threshold voltage becomes stable, and thus it can be suppressed that the threshold voltage changes in some cases or over time.

A formation method of the high resistance layer is not particularly limited, and various methods including the well-known methods can be adopted. The high resistance layer between the gate electrode and the threshold voltage adjustment layer can be formed, for example, by the following methods.

(1) Tungsten (W) or metal containing W is sputtered onto the threshold voltage adjustment layer. Thereby, a crystal defect layer is generated on the threshold voltage adjustment layer, and the crystal defect layer serves as a high resistance layer. In a semiconductor device manufactured in this way, the gate electrode contains tungsten (W), and the crystal defect layer which was generated in sputtering W or the metal containing W onto the threshold voltage adjustment layer is exposed on an interface between the gate electrode and the threshold voltage adjustment layer. When the threshold voltage adjustment layer is constituted of a p-type GaN, the high resistance layer can be formed by interposing one or more of the following (2) to (6) between the gate electrode and the threshold voltage adjustment layer:

(2) a p-type GaN containing impurities in a lower concentration than the p-type GaN of the threshold voltage adjustment layer (thereby having a higher resistance than the p-type GaN of the threshold voltage adjustment layer),
(3) an i-type GaN (GaN with no impurities added intentionally),
(4) an n-type GaN,
(5) a so-called insulating layer (selected from $SiO_2$, SiN, AlO, GaO, etc.), or
(6) a nitride semiconductor layer which forms a heterojunction with the threshold voltage adjustment layer.

Here, the high resistance layer is a layer having a higher resistance than the threshold voltage adjustment layer. Further, the term "layer" as used herein is not limited only to a layer having a thickness, and includes a bather which is formed in a pn junction or heterojunction and interrupts the transfer of carriers. A so-called insulating layer may be used as the high resistance layer. The insulating layer has an extremely high resistance, and hence is the most effective for suppressing changes in the threshold voltage.

The high resistance layer between the threshold voltage adjustment layer and the electron supply layer can be formed, for example, by the following methods.

(7) An $In_{x3}Al_{y3}Ga_{1-x3-y3}N$ layer having a wider band gap than both of the electron supply layer of $In_{x1}Al_{y1}Ga_{1-x1-y1}N$ and the threshold voltage adjustment layer of $In_{x2}Al_{y2}Ga_{1-x2-y2}N$ is interposed between the threshold voltage adjustment layer and the electron supply layer.
(8) When the electron supply layer contains aluminum (Al), an Al composition ratio of the electron supply layer is made high on a threshold voltage adjustment layer side and made low on an electron transit layer side. A region having the higher Al composition ratio is a high resistance layer.

Here, the high resistance layer is a layer having a higher resistance than both of the threshold voltage adjustment layer and the electron supply layer. In the case (8), the high resistance layer can be said to be a part of the electron supply layer. In this case, if a resistance of the electron supply layer in a range in which the electron supply layer is in contact with the threshold voltage adjustment layer is higher than a resistance of the electron supply layer in any other range of the electron supply layer, it can be said that the high resistance layer is interposed between the threshold voltage adjustment layer and the electron supply layer.

In the semiconductor device described herein, the transfer of carriers is prevented between the gate electrode and the threshold voltage adjustment layer as well as between the threshold voltage adjustment layer and the electron supply layer, which can prevent the change in the amount of electrification charges in the threshold voltage adjustment layer. Consequently, the threshold voltage becomes stable, and thus it can be suppressed that the threshold voltage changes in some cases or over time.

BRIEF DESCRIPTION OF DRAWINGS

FIG. 2 shows a cross-sectional view of a semiconductor device in a second embodiment and a distribution of an Al composition ratio.

DETAILED DESCRIPTION

Figure 1:
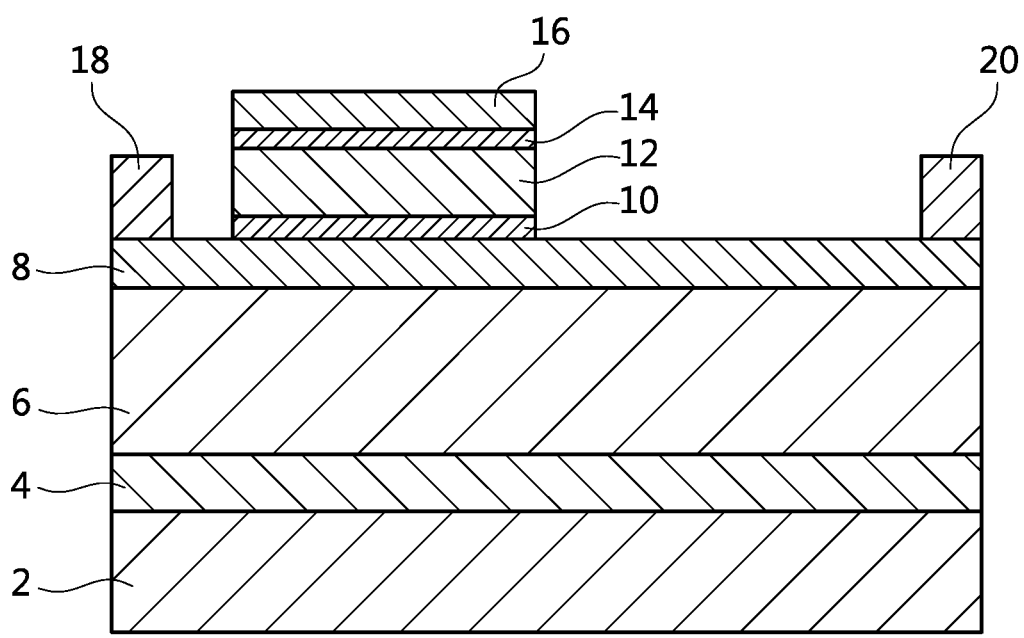
FIG. 1 shows a cross-sectional view of a semiconductor device in a first embodiment.

Now, some of features of the art disclosed herein will be listed. It should be noted that each of the following features independently have technical utility.

(Feature 1) A gate electrode is constituted of tungsten. A Schottky capacitance (C2) exists between the tungsten constituting the gate electrode and a nitride semiconductor constituting a threshold voltage adjustment layer. A capacitance (C1) also exists between the nitride semiconductor of the threshold voltage adjustment layer and a nitride semiconductor constituting an electron supply layer. A combined capacitance of the capacitance C1 and the capacitance C2 can control a threshold voltage.

(Feature 2) The gate electrode is constituted of tungsten silicide. In manufacturing lines for Si semiconductors, tungsten silicide is often used to form gate electrodes. Such a technique, which is often used, can be implemented.

(Feature 3) The electron supply layer is constituted of AlGaN, and the threshold voltage adjustment layer is constituted of GaN.

(Feature 4) An Al composition ratio in the electron supply layer changes continuously or intermittently along its depth.

(Feature 5) The Al composition ratio of the electron supply layer is 25% or more relative to a total amount of Al, In, and Ga, in a range in which the electron supply layer is in contact with the threshold voltage adjustment layer.

(Feature 6) The electron supply layer contains In, and the threshold voltage adjustment layer does not contain In.

(Feature 7) The electron supply layer does not contain In, and the threshold voltage adjustment layer contains In.

(Feature 8) Crystal defects exist in the threshold voltage adjustment layer constituted of a p-type $In_{x2}Al_{y2}Ga_{1-x2-y2}N$, and carriers are trapped in the crystal defects.

EMBODIMENTS

First Embodiment

FIG. 1 is a cross-sectional view of a semiconductor device (field-effect transistor using two-dimensional electron gas) in a first embodiment. A buffer layer 4 is formed by crystal growth on a substrate 2, an i-type GaN layer 6 is formed by crystal growth on the buffer layer 4, and an i-type $Al_{y1}Ga_{1-y1}N$ layer 8 (0<y1<1) is formed by crystal growth on the i-type GaN layer 6. Herein, an i-type is defined as a type of crystal growth without addition of impurities for p-type or n-type. In the present embodiment, y1=0.25, and a thickness of the i-type $Al_{y1}Ga_{1-y1}N$ layer 8 is 30 nm. In a heterojunction in which the GaN layer 8 containing Al is crystal-grown on the GaN layer 6 not containing Al, a band gap of the GaN layer 8 is wider than that of the GaN layer 6, and hence two-dimensional electron gas is generated in a region of the GaN layer 6 facing the heterojunction interface. In the present disclosure, the GaN layer 6 where the two-dimensional electron gas is generated is referred to as an electron transit layer, and the AlGaN layer 8 that creates the two-dimensional electron gas is referred to as an electron supply layer. A source electrode 18 and a drain electrode 20 are provided on a surface of the electron supply layer 8. The source electrode 18 and the drain electrode 20 are located apart from each other. A region of the electron supply layer 8 interposed between the source electrode 18 and the heterojunction interface, and a region of the electron supply layer 8 interposed between the drain electrode 20 and the heterojunction interface have a low resistance, for example, due to dispersion of metal constituting the electrodes 18 and 20. Since the electron transit layer 6 is of the i-type, its electron mobility is so high that the resistance between the source electrode 18 and the drain electrode 20 is low.

A p-type GaN layer 12 is provided on a part of the surface of the electron supply layer 8 located between the source electrode 18 and the drain electrode 20, and a gate electrode 16 is provided on a surface of the GaN layer 12. The gate electrode 16 is constituted of tungsten. When the p-type GaN layer 12 is provided on the surface of the electron supply layer 8, a depletion layer extends from an interface between the p-type GaN layer 12 and the electron supply layer 8 toward the electron transit layer 6 via the electron supply layer 8, thus affecting the generation of the two-dimensional electron gas. By adjusting an impurity concentration and the like in the p-type GaN layer 12, the threshold voltage can be adjusted. The p-type GaN layer 12 serves as a threshold voltage adjustment layer. In a plan view of the semiconductor substrate, the threshold voltage adjustment layer 12 and the gate electrode 16 partition a region between the source electrode 18 and the drain electrode 20.

A high resistance layer 14 is interposed between the gate electrode 16 and the threshold voltage adjustment layer 12. In the present embodiment, tungsten is sputtered on an upper surface of the threshold voltage adjustment layer 12, to thereby form the gate electrode 16. Then, a crystal defect layer is formed near the upper surface of the threshold voltage adjustment layer 12, and the crystal defect layer serves as the high resistance layer 14.

The high resistance layer 14 may not be a crystal defect layer. A p-type GaN containing impurities in a lower concentration than the p-type GaN of the threshold voltage adjustment layer (thereby having a high resistance), an i-type GaN, an n-type GaN, a so-called insulating layer (selected from $SiO_2$, SiN, MO, GaO, etc.), or a nitride semiconductor layer that forms a heterojunction with the threshold voltage adjustment layer 12 may be interposed between the gate electrode 16 and the threshold voltage adjustment layer 12. The high resistance layer 14 interposed between the gate electrode 16 and the threshold voltage adjustment layer 12 prevents carriers from transferring between the gate electrode 16 and the threshold voltage adjustment layer 12. Therefore, a leak current from the gate electrode 16 is suppressed to a lower level. If the so-called insulating film is used as the high resistance layer 14, the insulating film is the most effective for suppressing changes in the threshold voltage, since it has high insulation.

A high resistance layer 10 is also interposed between the threshold voltage adjustment layer 12 and the electron supply layer 8. In the present embodiment, the high resistance layer 10 is an $In_{x3}Al_{y3}Ga_{1-x3-y3}N$ layer that has a wider band gap than both of $Al_{0.2}Ga_{0.8}N$ of which the electron supply layer 8 is constituted and GaN of which the threshold voltage adjustment layer 12 is constituted. Since the high resistance layer 10 is interposed between the threshold voltage adjustment layer 12 and the electron supply layer 8, carriers do not transfer between the threshold voltage adjustment layer 12 and the electron supply layer 8. Coupled with the high resistance layer 14 preventing carriers from transferring between the gate electrode 16 and the threshold voltage adjustment layer 12, an amount of electrification charges in the threshold voltage adjustment layer 12 is kept constant at all times. Consequently, the threshold voltage of the field-effect transistor shown in FIG. 1 is stable at all times. It is suppressed that the threshold voltage changes in some cases or over time.

To form the threshold voltage adjustment layer 12 and the high resistance layer 10 on a part of the electron supply layer 8, etching may be performed under a condition where the threshold voltage adjustment layer 12 and the high resistance layer 10 are etched while the electron supply layer 8 is not etched. The electron supply layer 8 may be utilized as an etching stop layer. To this end, for example, the threshold voltage adjustment layer 12 and the high resistance layer 10 each may have a composition containing In, while the electron supply layer 8 may have a composition not containing In. Conversely, the threshold voltage adjustment layer 12 and the high resistance layer 10 each may have a composition not containing In, while the electron supply layer 8 may have a composition containing In. Since etching conditions differ depending on the presence or absence of In, it is possible to perform etching under the condition where the threshold voltage adjustment layer 12 and high resistance layer 10 are etched, while the electron supply layer 8 is not etched.

Second Embodiment

In a semiconductor device of a second embodiment, as shown in FIG. 2, the high resistance layer 10 that has a crystal structure different from that of the electron supply layer 8 does not exist. However, it should be noted that an Al composition ratio (i.e. a value of y1) of $Al_{y1}Ga_{1-y1}N$ ($0 \leq y1 < 1$, $0 < 1-y1 < 1$) of the electron supply layer 8 changes (inclines) in a depth direction. That is, on an upper surface of the electron supply layer 8 being in contact with the threshold voltage adjustment layer 12, y1 is 0.25 (i.e. y1=0.25), on a lower surface of the electron supply layer 8 being in contact with the electron transit layer 6, y1 is 0.05 (i.e. y1=0.05), and in a depth range between those surfaces, the y1 value continuously changes. In this case, the higher the Al composition ratio (y1 value) is, the higher the insulation and resistance of the electron supply layer 8 are. A range in which the electron supply layer 8 is in contact with the threshold voltage adjustment layer 12 and y1=0.25 has a higher resistance than a remaining region thereof, and thus it can be said that the electron supply layer 8 in the range is a high resistance layer. According to a technique of manufacturing a high resistance layer by changing a composition ratio of elements, crystal growth can be continuously performed while changing a blending ratio of raw material gases. This technique can shorten a manufacturing time. In contrast, to form a high resistance layer with a different composition itself from that of an existing layer, a step for stopping supply of one material gas and replacing it with another gas is required, resulting in a longer manufacturing time. In the field-effect transistor of the second embodiment as well, the leak current is low, and the threshold voltage is constantly stable. It is suppressed that the threshold voltage changes in some cases or over time.

Instead of interposing the high resistance layer 10 between the threshold voltage adjustment layer 12 and the electron supply layer 8, an entirety of the electron supply layer 8 can also be made to have a high resistance. For example, the Al composition ratio (y1 value) of $Al_{y1}Ga_{1-y1}N$ ($0 \leq y1 < 1$, $0 < 1-y1 < 1$) of the electron supply layer 8 is made at 0.25 or more over its entire thickness, and a thickness of the layer is made at 20 nm or more. Thereby, carriers can be prevented from transferring between the threshold voltage adjustment layer 12 and the electron supply layer 8. This method can also suppress the change in the threshold voltage.

Specific examples of the present invention have been described in detail, however, these are mere exemplary indications and thus do not limit the scope of the claims. The art described in the claims includes modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

What is claimed is:

1. A semiconductor device comprising:
    an electron transit layer constituted of gallium nitride;
    an electron supply layer constituted of $In_{x1}Al_{y1}Ga_{1-x1-y1}N$ ($0 \leq x1 < 1$, $0 \leq y1 < 1$, $0 < 1-x1-y1 < 1$) and provided on the electron transit layer;
    a source electrode provided on the electron supply layer;
    a drain electrode provided on the electron supply layer and is apart from the source electrode;
    a threshold voltage adjustment layer constituted of $In_{x2}Al_{y2}Ga_{1-x2-y2}N$ ($0 \leq x2 < 1$, $0 \leq y2 < 1$, $0 < 1-x2-y2 \leq 1$) of a p-type and provided on a part of the electron supply layer between the source electrode and the drain electrode; and
    a gate electrode provided on the threshold voltage adjustment layer,
    wherein
    the electron supply layer contains aluminum, and a composition ratio of aluminum in the electron supply layer increases continuously from a side of the electron supply layer adjacent the electron transit layer toward a side of the electron supply layer adjacent the threshold voltage adjustment layer, and
    a high resistance layer is interposed between the gate electrode and the threshold voltage adjustment layer.

2. The semiconductor device according to claim 1, wherein
    the gate electrode contains tungsten,
    a crystal defect layer which was generated in sputtering tungsten or metal containing tungsten onto the threshold voltage adjustment layer is exposed on an interface between the threshold voltage adjustment layer and the gate electrode, and
    the crystal defect layer is the high resistance layer.

3. The semiconductor device according to claim 1, wherein
    the threshold voltage adjustment layer constituted of gallium nitride of the p-type,
    one of p-type gallium nitride containing impurities in a lower concentration than the p-type gallium nitride of the threshold voltage adjustment layer, i-type gallium nitride, n-type gallium nitride, an insulating layer selected from $SiO_2$, SiN, MO, and GaO, or a nitride semiconductor layer which forms heterojunction with the threshold voltage adjustment layer is interposed between the gate electrode and the threshold voltage adjustment layer.

* * * * *